United States Patent
Hirano

(10) Patent No.: US 7,214,975 B2
(45) Date of Patent: May 8, 2007

(54) SEMICONDUCTOR DEVICE WITH CHARGE SHARE COUNTERMEASURE

(75) Inventor: Masashi Hirano, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 306 days.

(21) Appl. No.: 10/446,780

(22) Filed: May 29, 2003

(65) Prior Publication Data

US 2004/0189346 A1 Sep. 30, 2004

(30) Foreign Application Priority Data

Mar. 24, 2003 (JP) .......................... P2003-080985

(51) Int. Cl.
*H01L 29/768* (2006.01)
(52) U.S. Cl. .............................. 257/288; 257/E27.046; 257/350; 257/E29.129
(58) Field of Classification Search ................ 438/142, 438/199; 365/189.06; 257/288, 350, 351, 257/E27.046, E29.129, E29.158, E29.313
See application file for complete search history.

(56) References Cited

U.S. PATENT DOCUMENTS 5,757,714 A * 5/1998 Choi et al. ................. 365/226
RE36,821 E * 8/2000 Casper et al. ........... 365/230.06
6,222,404 B1 * 4/2001 Mehta et al. ................ 327/200
6,320,420 B1 * 11/2001 Shibayama .................. 326/95
2004/0108876 A1 * 6/2004 Fairbanks .................... 327/141

FOREIGN PATENT DOCUMENTS

| JP | 2-168724 | 6/1990 |
|---|---|---|
| JP | 5-218851 | 8/1993 |
| JP | 2000-59204 | 2/2000 |
| JP | 2000-163251 | 6/2000 |

OTHER PUBLICATIONS

U.S. Appl. No. 10/357,218, filed Feb. 4, 2003, Hirano et al.
U.S. Appl. No. 10/446,780, filed May 29, 2003, Hirano.

* cited by examiner

*Primary Examiner*—Caridad Everhart
(74) *Attorney, Agent, or Firm*—Oblon, Spivak, McClelland, Maier & Neustadt, P.C.

(57) ABSTRACT

An aspect of the present invention provides a semiconductor device that includes a logic circuit including at least one transistor with a first channel type, a first transistor with a second channel type configured to provide the logic circuit with a first voltage at a specified timing, and a precharge control unit configured to turn on at least one first channel type transistor in the logic circuit during the time when the first transistor with the second channel type provides the logic circuit with the first voltage, the precharge control unit configured to precharge a node coupled to a transistor of the first channel type in the logic circuit.

18 Claims, 6 Drawing Sheets

US 7,214,975 B2

SEMICONDUCTOR DEVICE WITH CHARGE SHARE COUNTERMEASURE

CROSS REFERENCE TO RELATED APPLICATIONS

This application is based upon and claims the benefit of priority from the prior Japanese Patent Application No. P2003-080985 filed on Mar. 24, 2003, the entire contents of which are incorporated herein by reference.

BACKGROUND OF THE INVENTION

1. Field of the Invention

The present invention relates generally to a semiconductor device, and more particularly, to a semiconductor device implemented a charge share countermeasure without adding a PMOS transistor for precharge.

2. Description of Related Art

FIG. 9 is a circuit diagram illustrating a semiconductor device of a related art. This semiconductor device includes a PMOS transistor 103 coupled to a power source and an NMOS transistor 105 coupled to the ground voltage. Furthermore, the gates of these transistors ate connected to a clock generator not shown in the drawing. The clock generator generates a clock signal CLK and inputs it to the gates of these transistors. An NMOS transistor 107 and an NMOS transistor 108 are connected in series between the PMOS transistor 103 and NMOS transistor 105. The circuit including these transistors is referred to as a dynamic circuit. A wire 109 is connected between the PMOS transistor 103 and NMOS transistor 107 and inverter 110 are connected to the wire 109. Based on inputting to the gates of the NMOS transistor 107 and NMOS transistor 108, the PMOS transistor 103 precharges the wire 109 and the NMOS transistor 105 discharges it. In this way, the inverter 110 operates accordingly.

However, this dynamic circuit has the following problem. Depending on the combination of the signals input to the gates of the NMOS transistor 107 and NMOS transistor 108, the electric charge at the wire 109 may transfer to a node 303 between the NMOS transistor 107 and NMOS transistor 108. Accordingly, there is a possibility of the inverter 110 malfunctioning since the voltage of the wire 109 gets lowered. This phenomenon is called charge share.

Consequently, in a conventional technique, the voltage of the wire 109 is prevented from being lowered by providing at the node 303, and similarly to the wire 109, a PMOS transistor 301 for precharge to make the voltages of the node 303 and wire 109 approximately equal.

However, with a conventional semiconductor device, since the node 303 is precharged by connecting the PMOS transistor 301, the capacity of the entire dynamic node is increased by the additional PMOS transistor 301. This results in affecting the operational speed of the dynamic circuit.

SUMMARY OF THE INVENTION

An aspect of the present invention provides a semiconductor device that includes, a logic circuit including at least one transistor with a first channel type, a first transistor with a second channel type configured to provide the logic circuit with a first voltage at a specified timing, and a precharge control unit configured to turn on at least one transistor with the first channel type in the logic circuit within the time period that the first transistor with the second channel type provides the logic circuit with the first voltage, the precharge control unit configured to precharge a node coupled to a transistor with the first channel type in the logic circuit.

DETAILED DESCRIPTION OF EMBODIMENTS

Figure 1:
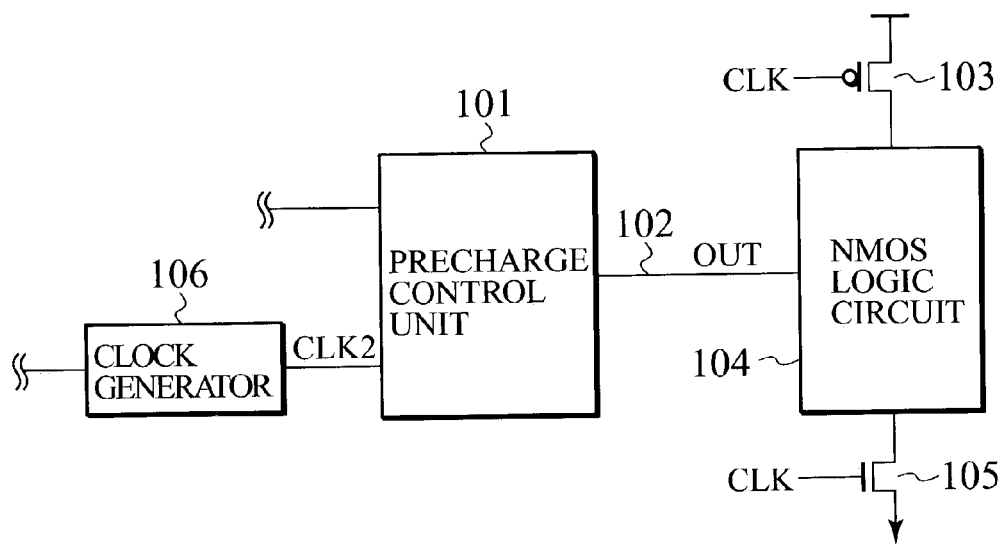
FIG. 1 is a block diagram illustrating an embodiment of a semiconductor device according to the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 1 is a block diagram illustrating an embodiment of a semiconductor device according to the present invention. This semiconductor device includes a precharge control unit 101, an NMOS logic circuit 104 that is connected to the precharge control unit 101 via a wire 102, and a PMOS transistor 103 that is connected to the NMOS logic circuit 104 and a power source. In addition, a semiconductor device of this embodiment includes an NMOS transistor 105 that is connected to the NMOS logic circuit 104 and a ground voltage, and a clock generator 106 that supplies clock signals to the precharge control unit 101. The NMOS logic circuit 104, PMOS transistor 103, and NMOS transistor 105 configure a dynamic circuit.

Here, the NMOS logic circuit 104 is a circuit with NMOS transistors and the realized predetermined functions. With this embodiment, the PMOS transistor 103 is connected to the NMOS logic circuit 104. The PMOS transistor 103 is connected to a power source to provide source voltage, and a clock signal CLK is input to its gate. The PMOS transistor 103 thereby supplies the voltage to the NMOS logic circuit 104 according to the clock signal CLK. The NMOS transistor 105 is connected to the NMOS logic circuit 104 and the ground voltage, and the clock signal CLK is input to its gate. Thereby, the NMOS transistor 105 operates according to the clock signal CLK. In particular, the NMOS transistor 105 prevents the electric current supplied from the PMOS transistor 103 from passing as a short-circuit current through the NMOS logic circuit 104. As a result, in a case where short current need not be considered, this embodiment can be put into effect without. the NMOS transistor 105.

Next, the precharge control unit 101 is described. When the voltage is supplied to the NMOS logic circuit 104 at a specified timing, the precharge control unit 101 turns on at least one transistor within the NMOS logic circuit 104 to precharge an intermediate node connected to at least one transistor. The precharge control unit 101 of this embodiment is connected to the NMOS logic circuit 104 via the wire 102. The precharge control unit 101 turns on an NMOS transistor connected to the node to which the electric charge transfers due to charge share within the NMOS logic circuit 104 so that when the PMOS transistor 103 is precharged, that node is simultaneously precharged. Here, in this embodiment, the gate of an NMOS transistor in the NMOS logic circuit 104 is turned on and off by supplying a clock signal OUT from the precharge control unit 101 to the NMOS logic circuit 104 via the wire 102.

Here, the clock signal OUT can either be generated by the precharge control unit 101, or the clock generator 106 can be connected to generate a specified clock and input it to the precharge control unit 101. As a result, this embodiment can be put into effect without the clock generator 106.

Figure 2:
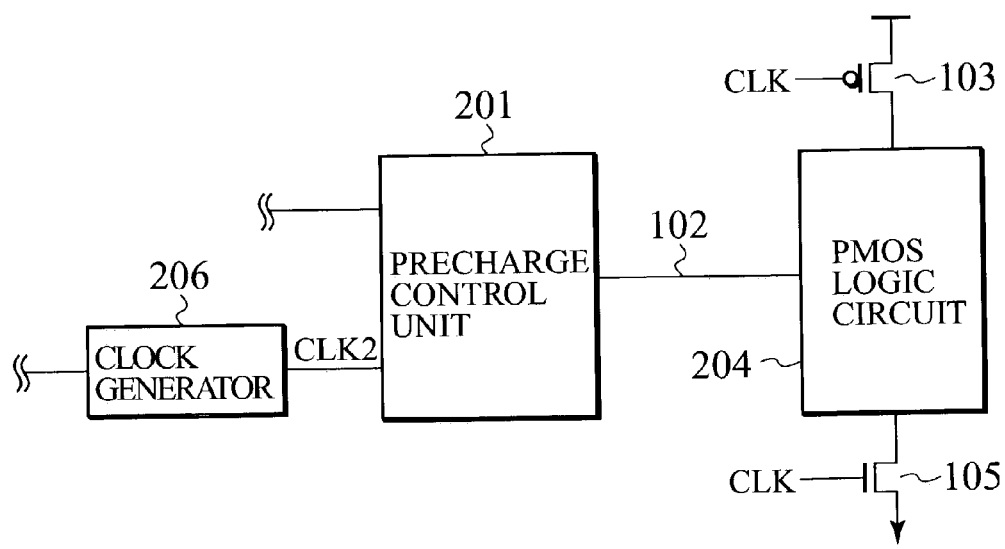
FIG. 2 is a block diagram illustrating another embodiment of a semiconductor device according to the present invention.

FIG. 2 is a block diagram illustrating another embodiment of a semiconductor device according to the present invention. Whereas an NMOS logic circuit is used in FIG. 1, this embodiment uses a PMOS logic circuit 204. In the case of the structure, the PMOS transistor 103 prevents the electric current supplied from the NMOS transistor 105 from passing through the PMOS logic circuit 204. As a result, this embodiment can be effected without the PMOS transistor 103. Furthermore, a precharge control unit 201 is connected to the PMOS logic circuit 204 via the wire 102. The precharge control unit 201 turns on a PMOS transistor connected to the node to which the electric charge transfers due to charge share within the PMOS logic circuit 204 so that when the NMOS transistor 105 is precharged, the relevant node is simultaneously precharged. Here, with this embodiment, the gate of a PMOS transistor in the PMOS logic circuit 204 is turned on and off by supplying a clock signal OUT from the precharge control unit 201 to the PMOS logic circuit 204 via the wire 102.

Here, the clock signal OUT can be either generated by the precharge control unit 201, or a clock generator 206 can be connected to generate a specified clock and input it to the precharge control unit 201. As a result, this embodiment can be put into effect without the clock generator 206.

Figure 3:
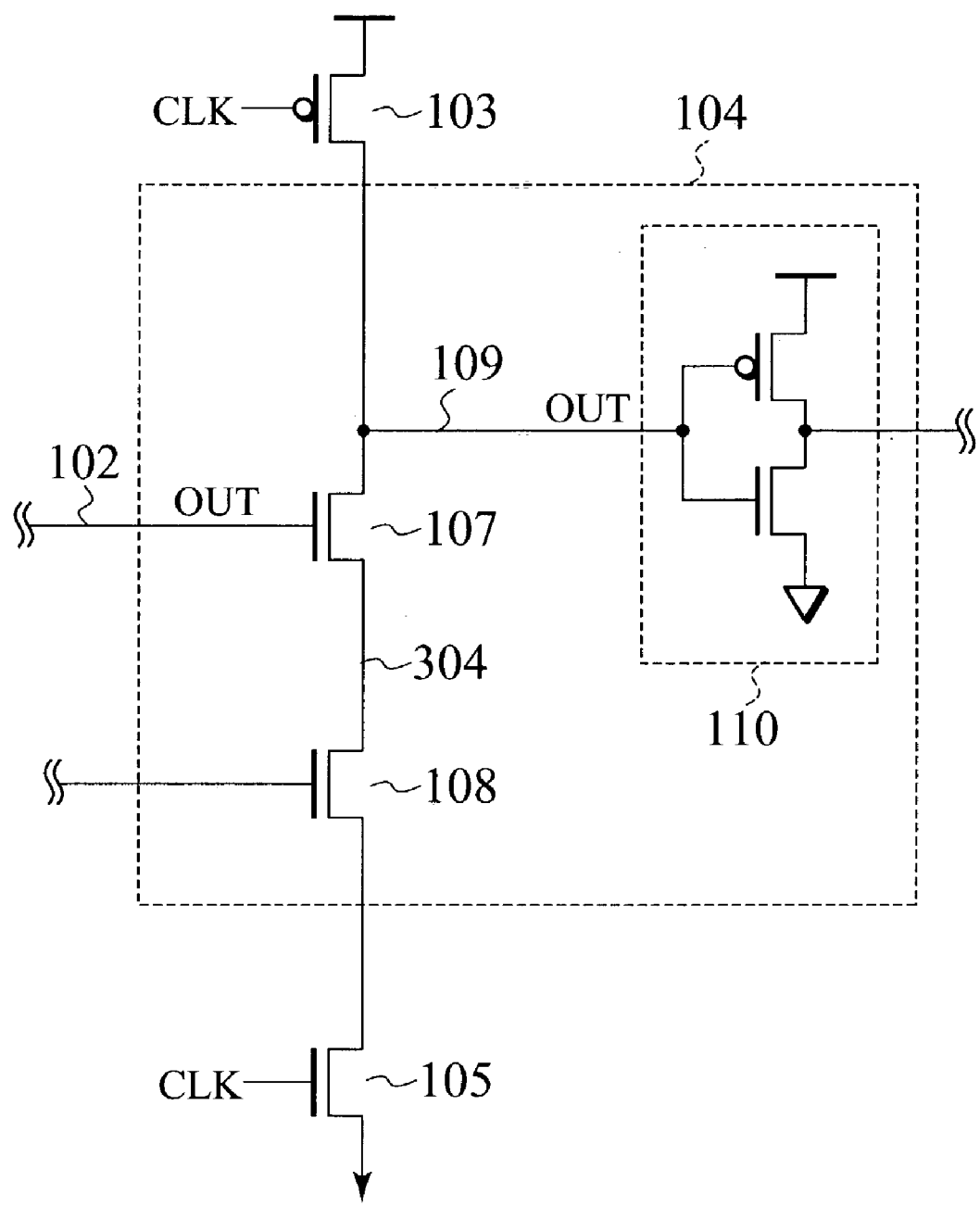
FIG. 3 is a circuit diagram illustrating the NMOS logic circuit 104 of this embodiment.

FIG. 3 is a circuit diagram illustrating the NMOS logic circuit 104 of this embodiment. The NMOS logic circuit 104 includes the NMOS transistor 107 whose gate is connected to the wire 102, and the NMOS transistor 108, which is connected to the NMOS transistor 107 in series and whose gate is connected to a combinational circuit not shown in the drawing. Furthermore, this embodiment includes the inverter 110, which is connected to the wire 109 connected to the source of the NMOS transistor 107. Here, the PMOS transistor 103 for precharge is turned on and off by input of a clock signal CLK; when turned on, it supplies a voltage of the power source to charge the wire 109. At the time of this charging, the gate of the NMOS transistor 107 is turned on so as to also simultaneously charge a node 304 between the NMOS transistor 107 and NMOS transistor 108. Accordingly, the voltages of the wire 109 and node 304 become approximately equal. By this means, a situation can be avoided whereby the electric charge at the wire 109 transfers to the node 304 between the NMOS transistor 107 and NMOS transistor 108 depending on the combination of the signals input to the gates of the NMOS transistor 107 and NMOS transistor 108.

Here, although the voltages of the wire 109 and node 304 are made approximately equal in this embodiment, this embodiment is not limited to this, and as long as the voltage of the wire 109 is not reduced by charge share to a level that causes the inverter 110 to malfunction, further charge is permissible. The level of charge can be controlled by the clock signal OUT.

Figure 4:
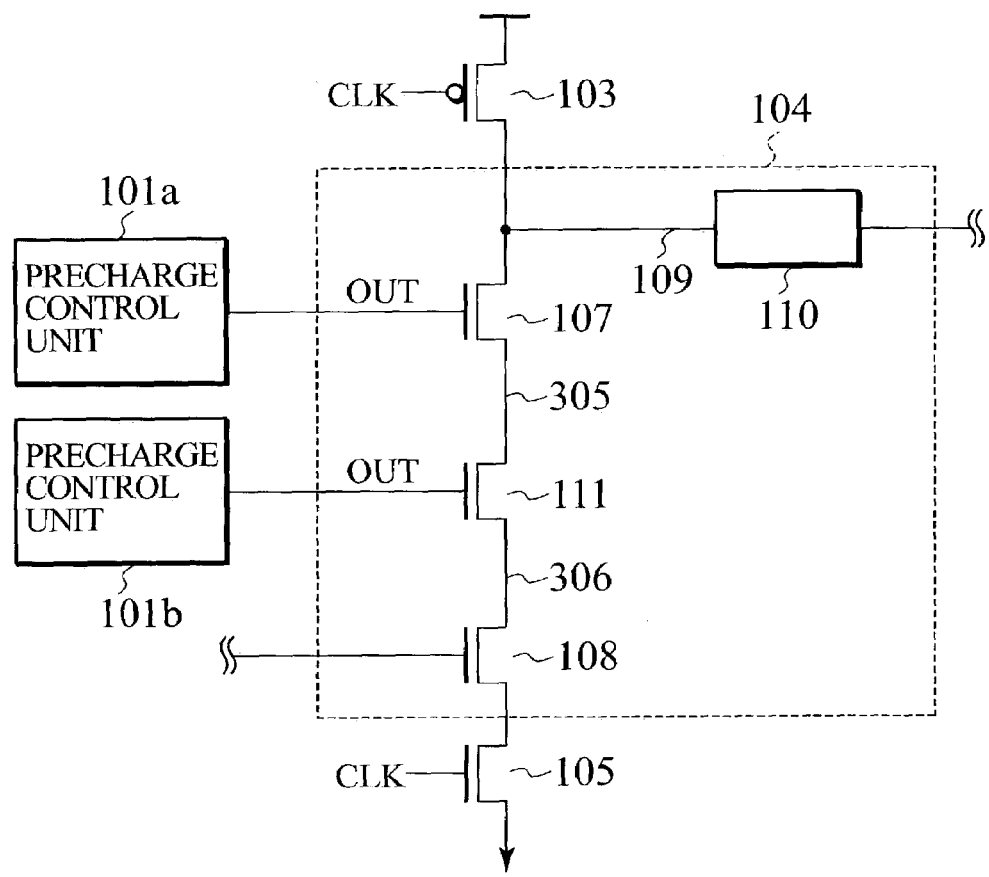
FIG. 4 is a circuit diagram illustrating the NMOS logic circuit 104 of another embodiment.

FIG. 4 is a circuit diagram illustrating the NMOS logic circuit 104 of another embodiment. In this embodiment, NMOS transistors 107, 111, and 108 are provided as shown in the drawing. Precharge control units 101a and 101b are connected to the gates of the NMOS transistors 107 and 111, respectively. At the time when the PMOS transistor 103 for precharge is charged, the gate of the NMOS transistor 107 is turned on so as to also simultaneously charge a node 305 between the NMOS transistor 107 and NMOS transistor 111, and a node 306 between the NMOS transistor 111 and NMOS transistor 108. Accordingly, the nodes 305 and 306 are charged (not limited to full charge). By this means, the situation can be avoided whereby the electric charge at the wire 109 transfers to the nodes 305 and 306 between the NMOS transistor 107 and NMOS transistor 108 depending on the combination of the signals input to the gates of the NMOS transistor 107 and NMOS transistor 108.

Figure 5:
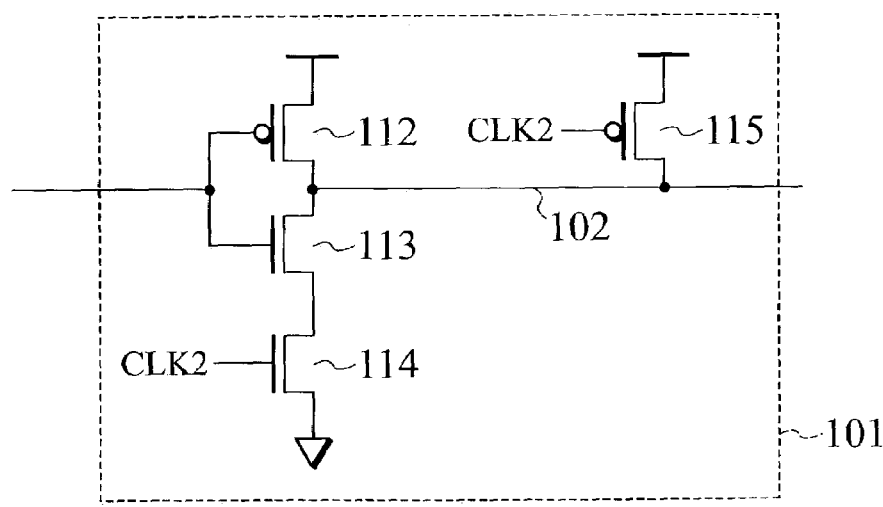
FIG. 5 is a circuit diagram illustrating the precharge control unit 101 of this embodiment.

FIG. 5 is a circuit diagram illustrating the precharge control unit 101 of this embodiment. At the time when the logic circuit is precharged, the precharge control unit 101 turns on the gates of the transistors within the logic circuit so that the predetermined nodes are also charged. This is done by supplying, at the specified timing, a type of signal that turns on the gates of the transistors within the logic circuit. The precharge control unit 101 of this embodiment includes a PMOS transistor 115, whose source is connected to the power source, whose gate receives the input of a clock signal CLK2, and whose drain is connected to the wire 102. The PMOS transistor 115 allows a power source to be supplied to the wire 102 at the timing specified by the clock signal CLK2. In addition, the precharge control unit 101 of this embodiment includes a PMOS transistor 112, an NMOS transistor 113, and an NMOS transistor 114. For the PMOS transistor 112, its source is connected to the power source, and its drain is connected to the wire 102. For the NMOS transistor 113, its drain is connected to the drain of the PMOS transistor 112, and its gate is connected to the gate of the PMOS transistor 112. For the NMOS transistor 114, its drain is connected to the source of the NMOS transistor 113, its source is connected to the ground potential, and the clock signal CLK2 is input to its gate. These transistors 112, and 113 configure an inverter. Such as is described in this embodiment, a circuit configured to make a logical adjustment may be implemented.

Figure 6:
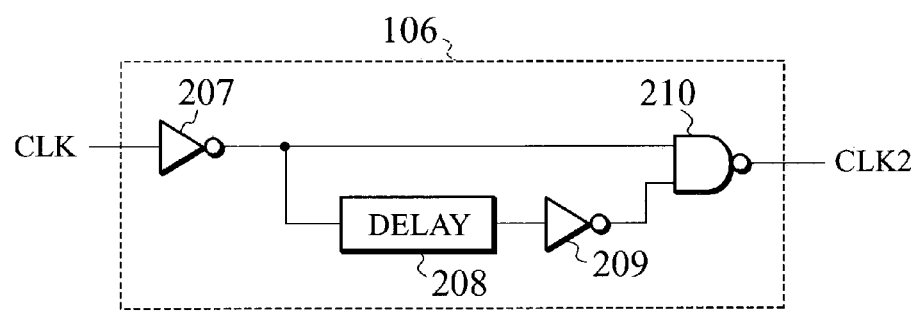
FIG. 6 is a circuit diagram illustrating the clock generator 106 of this embodiment.

FIG. 6 is a circuit diagram illustrating the clock generator 106 of this embodiment. The clock generator 106 includes an INV gate 207 that inverts and outputs an input signal, a delay circuit 208 that delays and outputs the signal output from the INV gate 207, an INV gate 209 that inverts and outputs the signal output from the delay circuit 208, and a NAND gate 210 that outputs the non conjunction of the signals output from the INV gate 207 and INV gate 209. On receiving input of the clock signal CLK, the clock generator 106 is capable of outputting the clock signal CLK2. Here, the high period of the signal OUT can be adjusted by adjusting the length of the low period of the clock signal CLK2. Accordingly, the high period of the signal OUT can be adjusted through adjustment of the delay of the delay circuit 208. A plurality of inverters for signal inversion that can be connected as a chain to form an inverter chain or the like to delay the output of the signal can be used as the delay circuit 208.

Figure 7:
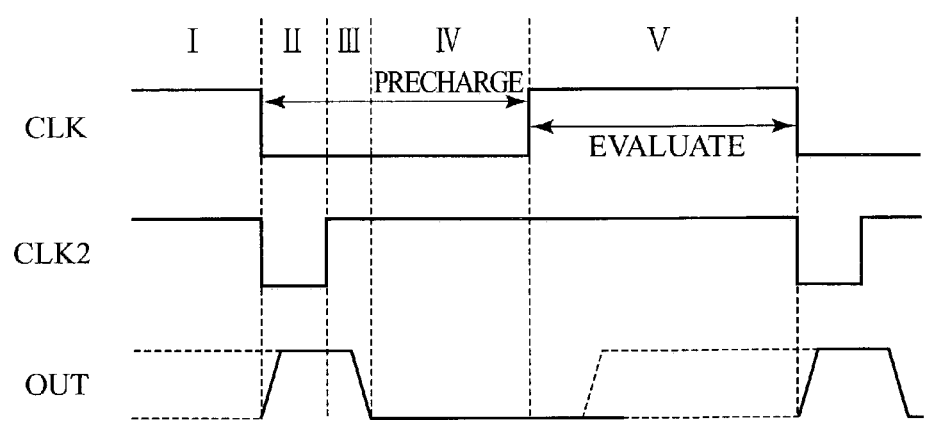
FIG. 7 illustrates a timing diagram for explaining the operation of a semiconductor device according to this embodiment.

FIG. 7 illustrates a timing diagram for explaining the operation of a semiconductor device according to this embodiment. The signals in this timing diagram are from the top to the bottom: clock signal CLK, clock signal CLK2, and signal OUT. The clock signal CLK is a clock signal input to the PMOS transistor 103, NMOS transistor 105, and the like. When the clock signal CLK is low, the PMOS transistor 103 is on and the NMOS logic circuit is precharged. Furthermore, when the clock signal CLK is high, this represents the evaluative period. Here, in this timing diagram, when the clock signal CLK transits from high (state I) to low, the clock signal CLK2 transits from high to low (state II). In the state II, transition from low to high of the clock signal CLK turns on the PMOS transistor 112 of FIG. 5. Furthermore, transition from low to high of the clock signal CLK2 turns on the PMOS transistor 115. Therefore, the signal OUT on the wire 102 becomes high for a certain period (states II and III). Accordingly, the NMOS transistor 107 shown in FIG. 3 and the NMOS transistors 107 and 108 shown in FIG. 4 turn on, and the node 304 or the nodes 305 and 306 shown in FIG. 4 are charged. Thereafter, when the precharge period (states II, III, and IV) of the clock signal CLK finishes and the evaluative period (state V) begins, the signal OUT becomes either high or low.

Here, the signal OUT needs to be high for merely part of the period the clock signal CLK is low, since the high period only has to be long enough to charge the above nodes. Accordingly, the signal OUT does not need to be on immediately after the clock signal CLK has entered a low level. Furthermore, the length of the high period of the signal OUT determines the amount of charge for the above nodes. In other words, the longer the high period of the signal OUT is high, the longer the period of the gate of the NMOS transistor 107 is on, and the charge time exactly matches that time interval. The amount of charge at node 304 becomes correspondingly greater. On the other hand, the shorter the high period of the signal OUT is high, the shorter the period of the gate of the NMOS transistor 107 is on, and the charge time decreases by exactly that time interval. Accordingly, the amount of charge at node 304 decreases. Here, from the viewpoint of speeding up the circuit, since a small amount of charge is favorable, the high period of the signal OUT being short is favorable. However, in the case where the high period is too short, charge share has a possibility of causing circuit (e.g. circuit 110) malfunction. Therefore, it is preferable for the period of charging a node to be short insofar as it does not cause a circuit to malfunction. The high period of the signal OUT should be determined taking into consideration the above points.

As described so far, with this embodiment, the amount of charge at a node can be controlled through control of the high period of the signal OUT. As mentioned above, the speeding up of the entire circuit can be achieved by controlling the amount of charge.

Figure 8:
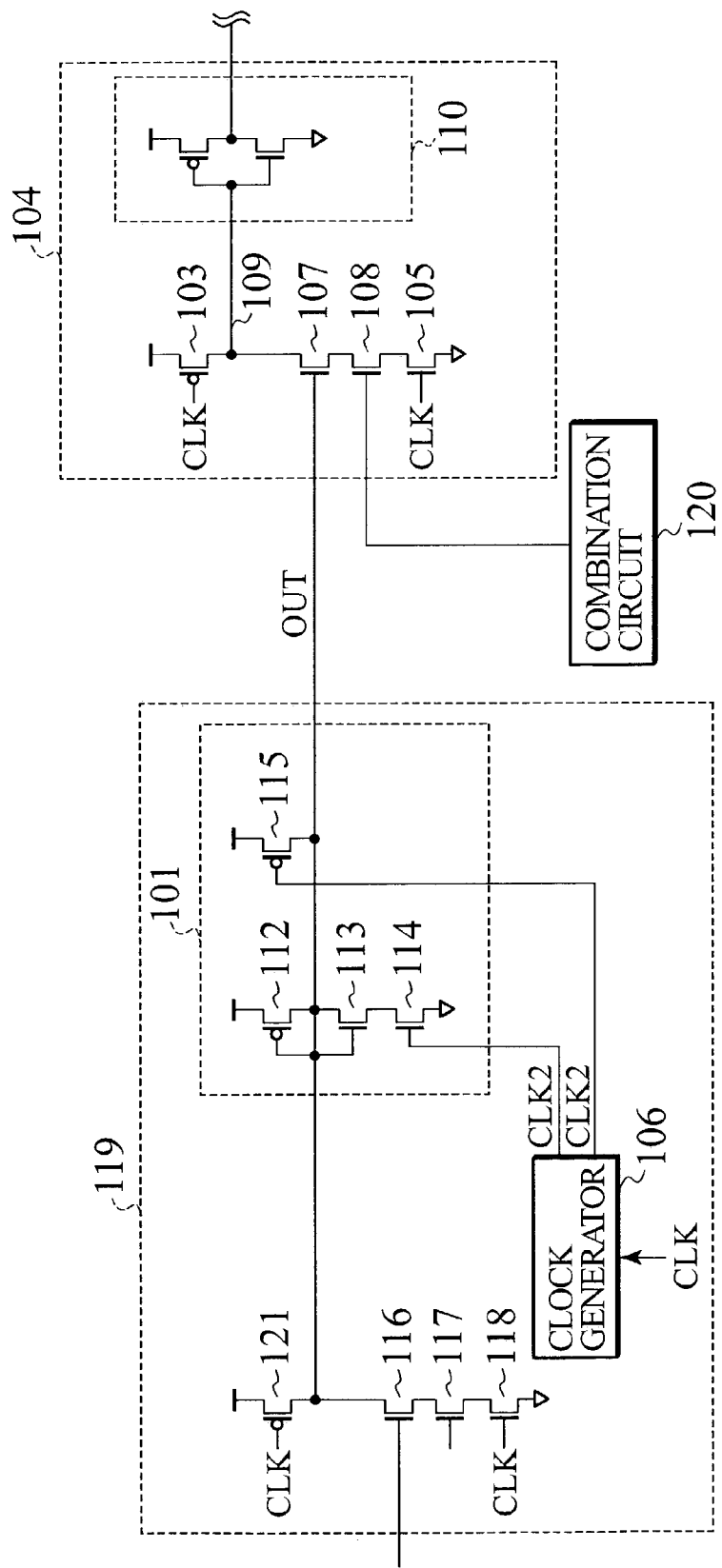
FIG. 8 is a block diagram illustrating a second embodiment of a semiconductor device according to the present invention.
Figure 9:
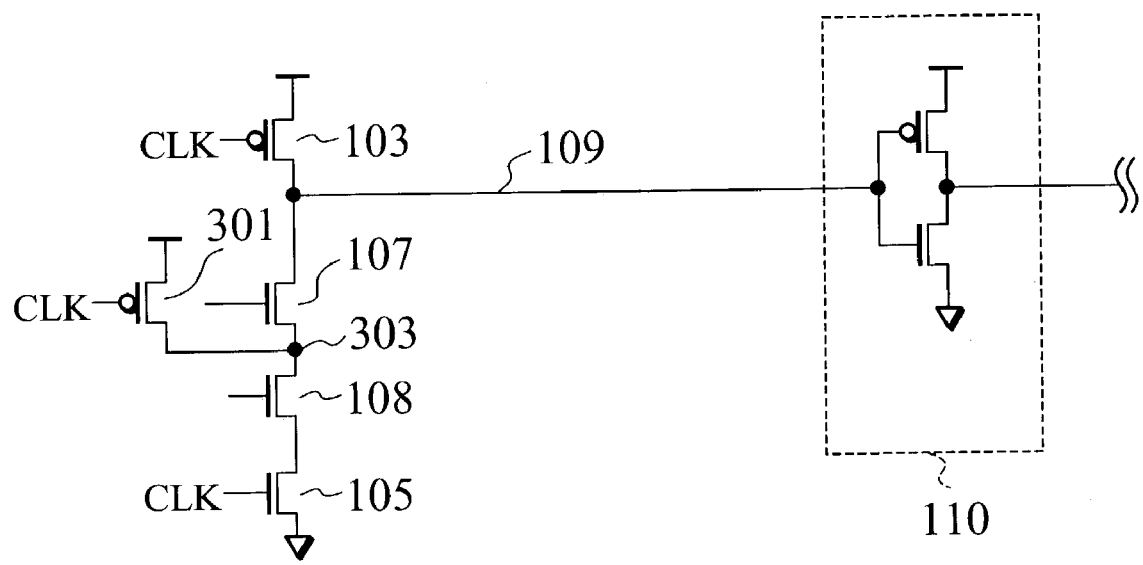
FIG. 9 is a circuit diagram illustrating a semiconductor device of a related art.

FIG. 8 is a block diagram illustrating a second embodiment of a semiconductor device according to the present invention. The semiconductor device includes a circuit 119, a circuit 104, and a combinational circuit 120. The circuit 104 receives the outputs of the circuit 119 and combinational circuit 120. Furthermore, the circuit 119 is provided with a dynamic circuit, which includes a PMOS transistor 121, an NMOS transistor 118, an NMOS transistor 116, and an NMOS transistor 117. The structure of the dynamic circuit is similar to that of the dynamic circuit that is provided within the circuit 104 and includes the PMOS transistor 103, NMOS transistor 107, NMOS transistor 108, and NMOS transistor 105. On the other hand, the circuit 119 has a precharge control unit 101. The structure of the precharge control unit 101 is similar to that in FIG. 5. Furthermore, the precharge control unit 101 has a structure whereby a single PMOS transistor 115 and a single NMOS transistor 119 are added to the structure of the inverter 110 provided within the circuit 104. As described so far, since the precharge control unit of this embodiment can be configured by adding partial circuitry to an existing circuit, it can be simply implemented. Here, in a case where the wire from the combinational circuit 120 to the wire 109 via the NMOS transistor 108 becomes a critical path, the speed of the entire circuit can be improved by taking a countermeasure against charge share at the NMOS transistor 107.

As described so far, with a semiconductor device of this embodiment, the conventional PMOS transistor for precharge is no longer necessary, and the capacity of the entire dynamic node can be reduced. Furthermore, the circuit can be operated at high speed.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A semiconductor device comprising:
   a logic circuit including at least one transistor with a first channel type;
   a first transistor with a second channel type configured to provide the logic circuit with a first voltage at a specified timing to precharge a first node coupled to a source or drain of the transistor with the first channel type; and
   a precharge control unit configured to turn on at least one transistor with the first channel type in the logic circuit during a time when the first transistor with the second channel type provides the logic circuit with the first voltage, to precharge a second node coupled to a drain or source of the transistor with the first channel type in the logic circuit;
   wherein the precharge control unit is configured to turn on at least one transistor with the first channel type in the logic circuit at a part of the time when the first transistor with the second channel type provides the logic circuit with the first voltage.

2. The semiconductor device as claimed in claim 1, wherein the second channel type first transistor includes:
   a gate configured to receive a first clock signal;
   a source coupled to a first power source that provides the first voltage; and
   a drain coupled to the logic circuit, the drain configured to provide the logic circuit with the first voltage according to the first clock signal.

3. A semiconductor device comprising:
   a logic circuit including at least one transistor with a first channel type;
   a first transistor with a second channel type configured to provide the logic circuit with a first voltage at a specified timing; and
   a precharge control unit configured to turn on at least one transistor with the first channel type in the logic circuit during a time when the first transistor with the second channel type provides the logic circuit with the first voltage, the precharge control unit configured to precharge a node coupled to a transistor with the first channel type in the logic circuit, wherein the second channel type of first transistor includes:

a gate configured to receive a first clock signal;

a source coupled to a first power source that provides the first voltage; and a drain coupled to the logic circuit, the drain configured to provide the logic circuit with the first voltage according to the first clock signal, wherein the precharge control unit is configured to turn on at least one transistor with the first channel type in the logic circuit after the first transistor with the second channel type is turned on, the precharge control unit is configured to turn off at least one transistor with the first channel type in the logic circuit before the transistor with the second channel type transistor is turned off.

4. A semiconductor device comprising:

a logic circuit including at least one transistor with a first channel type;

a first transistor with a second channel type configured to provide the logic circuit with a first voltage at a specified timing; and a precharge control unit configured to turn on at least one transistor with the first channel type in the logic circuit during a time when the first transistor with the second channel type provides the logic circuit with the first voltage, the precharge control unit configured to precharge a node coupled to a transistor with the first channel type in the logic circuit, wherein the second channel type of first transistor includes:

a gate configured to receive a first clock signal;

a source coupled to a first power source that provides the first voltage; and a drain coupled to the logic circuit, the drain configured to provide the logic circuit with the first voltage according to the first clock signal, wherein the precharge control unit is configured to turn on at least one transistor with the first channel type in the logic circuit at a part of the time when the first transistor with the second channel type provides the logic circuit with the first voltage, wherein the precharge control unit includes a second transistor with the second channel type, the second transistor with the second channel type including:

a gate configured to receive a second clock signal;

a source coupled to the first power source that provides the first voltage; and a drain coupled to a gate of a transistor with the first channel type in the logic circuit.

5. The semiconductor device as claimed in claim 4, wherein the precharge control unit further comprises:

a third transistor with the second channel type including:

a source coupled to the first power source that provides the first voltage; and a drain coupled to a gate of at least one transistor with the first channel type in the logic circuit;

a first transistor with the first channel type including:

a source coupled to the drain of the third transistor with the second channel type; and a gate coupled to the gate of the third transistor with the second channel type; and a second transistor with the first channel type including:

a gate configured to receive the second clock signal;

a source coupled to a drain of the first transistor with the first channel type; and a drain coupled to a second power source that provides second voltage.

6. The semiconductor device as claimed in claim 5, wherein the clock generator further comprises:

a first INV gate configured to receive the first clock signal to invert the first clock signal;

a delay circuit configured to receive an output signal of the first INV gate, the delay circuit configured to delay the output signal of the first INV gate;

a second INV gate configured to receive the output signal of the first INV gate to invert the output signal of the delay circuit; and a NAND gate configured to receive the output signals of the first INV gate and the second INV gate to output negative AND operation of the output signals of the first INV gate and the second INV gate as the second clock signal.

7. The semiconductor device as claimed in claim 6, further comprising a third transistor with the first channel type coupled to the logic circuit.

8. The semiconductor device as claimed in claim 7, further comprising:

a fourth transistor with the first channel type including:

a source coupled to the drain of the first transistor with the second channel type; and a gate coupled to the precharge control unit;

a fifth transistor with the first channel type including:

a source coupled to the drain of the third transistor with the first channel type; and a gate coupled to a combination circuit.

9. The semiconductor device as claimed in claim 8, wherein the logic circuit comprises:

a fourth transistor with the second channel type including:

a source coupled to the first power source providing a first voltage; and a gate coupled to the source of the fourth transistor with the first channel type; and a sixth transistor with the first channel type including:

a source coupled to the drain of the fourth transistor with the second channel type;

a gate coupled to the gate of the fourth transistor with the second channel type; and a drain coupled to the second power source providing the second voltage.

10. A semiconductor device comprising:

a logic circuit including at least one transistor with a first channel type;

a first transistor with a second channel type configured to provide the logic circuit with a first voltage at a specified timing; and a precharge control unit configured to turn on at least one transistor with the first channel type in the logic circuit during a time when the first transistor with the second channel type provides the logic circuit with the first voltage, the precharge control unit configured to precharge a node coupled to a transistor with the first channel type in the logic circuit, wherein the precharge control unit is configured to turn on at least one transistor with the first channel type in the logic circuit after the first transistor with the second channel type is turned on, wherein the precharge control unit is configured to turn off at least one transistor with the first channel type in the logic circuit before the transistor with the second channel type transistor is turned off.

11. The semiconductor device as claimed in claim 10, wherein the precharge control unit includes a second transistor with the second channel type, the second transistor with the second channel type including:
a gate configured to receive second clock signal;
a source coupled to the first power source that provides the first voltage; and
a drain coupled to a gate of a transistor with the first channel type in the logic circuit.

12. The semiconductor device as claimed in claim 11, wherein the precharge control unit further comprises:
a third transistor with the second channel type including:
a source coupled to the first power source that provides the first voltage; and
a drain coupled to a gate of at least one transistor with the first channel type in the logic circuit;
a first transistor with the first channel type including:
a source coupled to the drain of the third transistor with the second channel type; and
a gate coupled to the gate of the third transistor with the second channel type; and
a second transistor with the first channel type including:
a gate configured to receive the second clock signal;
a source coupled to a drain of the first transistor with the first channel type; and
a drain coupled to a second power source that provides second voltage.

13. A semiconductor device comprising:
a logic circuit including at least one transistor with a first channel type;
a first transistor with a second channel type configured to provide the logic circuit with a first voltage at a specified timing; and
a precharge control unit configured to turn on at least one transistor with the first channel type in the logic circuit during a time when the first transistor with the second channel type provides the logic circuit with the first voltage, the precharge control unit configured to precharge a node coupled to a transistor with the first channel type in the logic circuit,
wherein the clock generator further comprises:
a first INV (Inverter) gate configured to receive the first clock signal to invert the first clock signal;
a delay circuit configured to receive an output signal of the first INV gate, the delay circuit configured to delay the output signal of the first INV gate;
a second INV gate configured to receive the output signal of the first INV gate to invert the output signal of the delay circuit; and
a NAND gate configured to receive the output signals of the first INV gate and the second INV gate to output negative AND operation of the output signals of the first INV gate and the second INV gate as a second clock signal.

14. The semiconductor device as claimed in claim 13, wherein the precharge control unit further comprises:
a third transistor with the second channel type including:
a source coupled to the first power source that provides the first voltage; and
a drain coupled to a gate of at least one transistor with the first channel type in the logic circuit;
a first transistor with the first channel type including:
a source coupled to the drain of the third transistor with the second channel type; and
a gate coupled to the gate of the third transistor with the second channel type; and
a second transistor with first channel type including:
a gate to receive the second clock signal;
a source coupled to the drain of the first transistor with the first channel type; and
a drain coupled to a second power source that provides second voltage.

15. The semiconductor device as claimed in claim 14, further comprising:
a fourth transistor with the first channel type including:
a source coupled to the drain of the first transistor with the second channel type; and
a gate coupled to the precharge control unit;
a fifth transistor with the first channel type including:
a source coupled to the drain of the third transistor with the first channel type; and
a gate coupled to a combination circuit.

16. The semiconductor device as claimed in claim 15, wherein the logic circuit comprises:
a fourth transistor with the second channel type including:
a source coupled to the first power source providing a first voltage; and
a gate coupled to the source of the fourth transistor with the first channel type; and
a sixth transistor with the first channel type including:
a source coupled to the drain of the fourth transistor with the second channel type;
a gate coupled to the gate of the fourth transistor with the second channel type; and
a drain coupled to the second power source providing the second voltage.

17. A semiconductor device comprising:
a logic circuit including at least one transistor with a first channel type;
a first transistor with a second channel type configured to provide the logic circuit with a first voltage at a specified timing; and
a precharge control unit configured to turn on at least one transistor with the first channel type in the logic circuit during a time when the first transistor with the second channel type provides the logic circuit with the first voltage, the precharge control unit configured to precharge a node coupled to a transistor with the first channel type in the logic circuit,
wherein the clock generator further comprises:
a first INV gate configured to receive the first clock signal to invert the first clock signal;
a delay circuit configured to receive an output signal of the first INV gate, the delay circuit configured to delay the output signal of the first INV gate;
a second INV gate configured to receive the output signal of the first INV gate to invert the output signal of the delay circuit; and
a NAND gate configured to receive the output signals of the first INV gate and the second INV gate to output negative AND operation of the output signals of the first INV gate and the second INV gate as a second clock signal.

18. The semiconductor device as claimed in claim 17, further comprising a third transistor with the first channel type coupled to the logic circuit.

* * * * *